US006773273B2

(12) United States Patent
Yu

(10) Patent No.: US 6,773,273 B2
(45) Date of Patent: Aug. 10, 2004

(54) ELECTRICAL CARD CONNECTOR ASSEMBLY

(75) Inventor: Hung-Chi Yu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/324,952

(22) Filed: Dec. 19, 2002

(65) Prior Publication Data

US 2004/0097106 A1 May 20, 2004

(30) Foreign Application Priority Data

Nov. 20, 2002 (TW) ...................................... 91218634 U

(51) Int. Cl.[7] ........................... H05K 1/00; H01R 12/00
(52) U.S. Cl. ........................................... 439/79; 439/78
(58) Field of Search ............................. 439/79, 92, 64, 439/159, 541.5, 78

(56) References Cited

U.S. PATENT DOCUMENTS 5,636,999 A * 6/1997 Hirai et al. ................... 439/79
6,358,089 B1 * 3/2002 Kuroda et al. .............. 439/607
6,478,586 B1 * 11/2002 Ma ............................. 439/79
6,551,117 B2 * 4/2003 Poplawski et al. ............ 439/92
6,592,268 B2 * 7/2003 Chen et al. ................... 385/88

* cited by examiner

*Primary Examiner*—Michael C. Zarroli
(74) *Attorney, Agent, or Firm*—Wei Te Chung

(57) ABSTRACT

A card connector assembly (100) includes a header (6) mounted on a board (70) and a card connector (9) in which a card is received. The header has a number of contacts (60) electrically connected with the board. The card connector has an insulative base (1), a plurality of terminals (2) attached to the insulative base and a pair of guiding arms (41). The pair of guiding arms each define a guiding channel (40) in an inner side thereof for guiding the card to engage with the terminals. The card connector mates with the header connector with elongated sides of the guiding arms being perpendicular with the board and with the terminals conductively connecting with the contacts thereby establishing electrical paths between the card and the board.

5 Claims, 4 Drawing Sheets

ELECTRICAL CARD CONNECTOR ASSEMBLY

BACKGROUND OF THE INVENTION

1. Field of the Invention

The present invention generally relates to an electrical connector assembly, and particularly to an electrical card connector assembly for perpendicularly electrically connecting a card with a printed circuit board.

2. Description of Prior Arts

Taiwan Patent No. 383950 discloses a conventional card connector assembly. The conventional card connector assembly includes a card connector and a header mating with the card connector. The card connector and the header each comprise a plurality of contacts received in an insulative housing. The contacts of the card connector and the contacts of the header conductively connect with each other to thereby electrically connecting a card received in the card connector to a board on which the header is mounted. However, the insertion of the card is parallel with the board so that a large torque will be occurred when the card connector engages to the header, which will affect reliability of the signal transmission between the card and the board. Moreover, the card connector assembly which is parallelly assembled on the board parallel occupies a large horizontal space. When there is limited horizontal space on the board, the application of this kind of card connector assembly is notably limited.

Hence, an improved card connector assembly is highly desired.

BRIEF SUMMARY OF THE INVENTION

Accordingly, an object of the present invention is to provide a card connector assembly which saves horizontal space above a board on which the card connector assembly is mounted.

In order to achieve the above-mentioned object, a card connector assembly in accordance with the present invention comprises a header mounted on a board and a card connector in which a card is received. The header has a number of contacts electrically connected with corresponding circuit traces on the board. The card connector has an insulative base, a plurality of terminals attached to the insulative base and a pair of guiding arms. The pair of guiding arms locate at opposite sides of the insulative base, each defining a guiding channel in an inner elongate side thereof for guiding the card to be inserted therealong for engaging with the terminals. The card connector mates with the header connector with the elongated sides of the guiding arms being perpendicular with the board and with the terminals conductively connecting with the contacts thereby establishing electrical paths between the card and the board.

Other objects, advantages and novel features of the invention will become more apparent from the following detailed description of the present embodiment when taken in conjunction with the accompanying drawings.

DETAILED DESCRIPTION OF THE INVENTION

Figure 1:
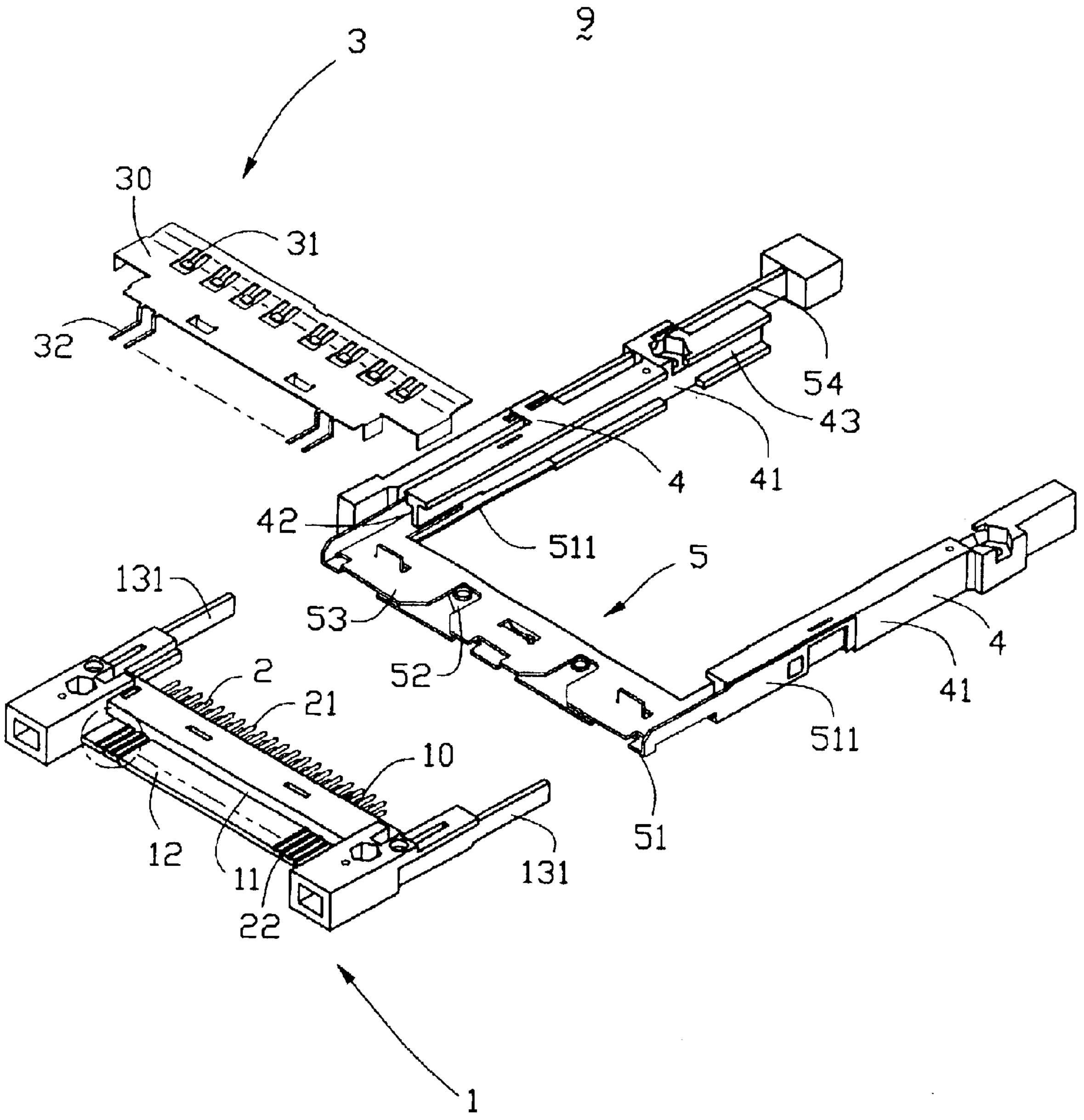
FIG. 1 is an exploded, perspective view of a card connector.

Reference will now be made to the drawing figures to describe the present invention in detail.

Figure 3:
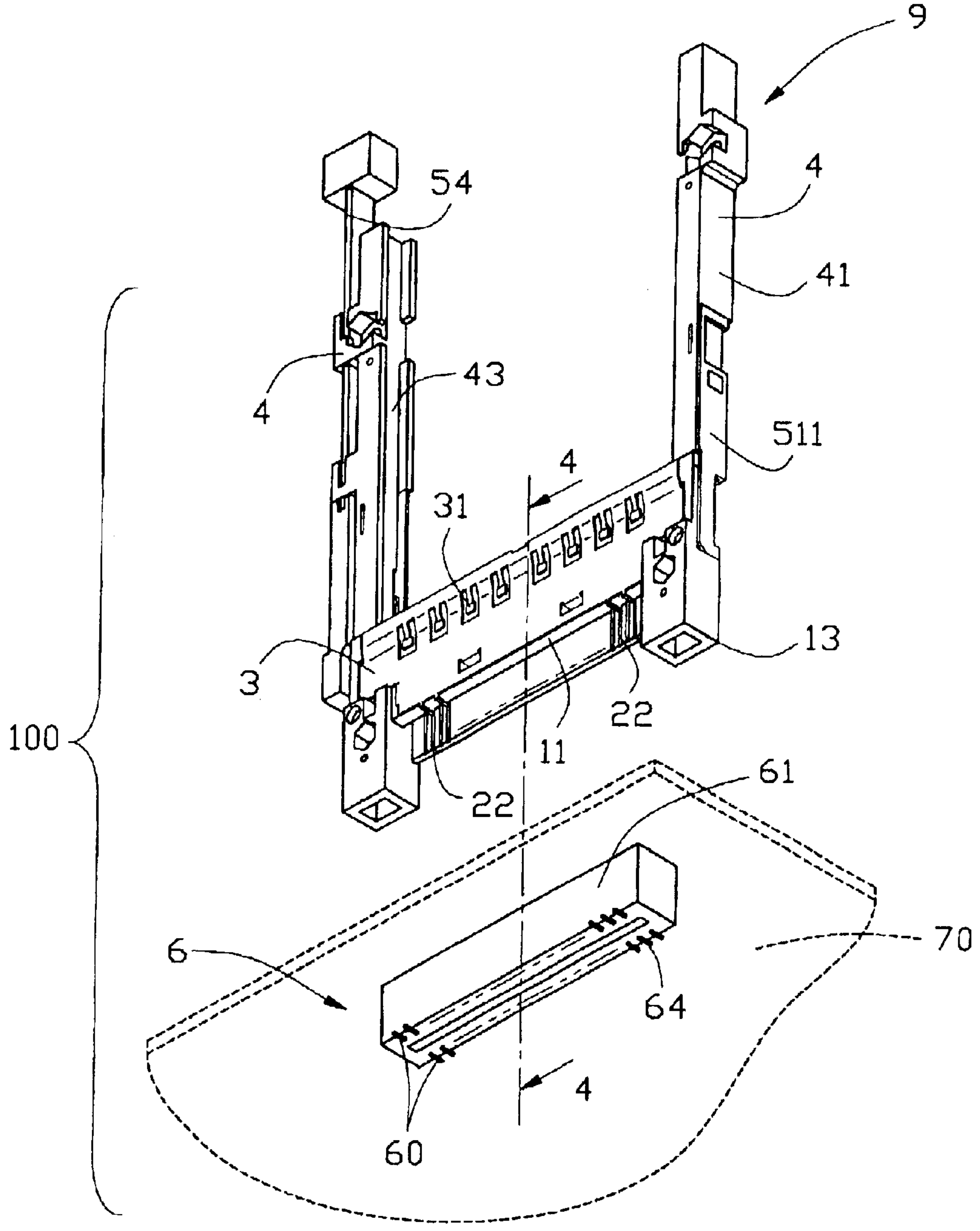
FIG. 3 is an exploded, perspective view of an electrical card connector assembly including a card connector and a header.

Referring to FIG. 3, an electrical card connector assembly 100 for electrically connecting a card (not shown) to a printed circuit board 70, includes a card connector 9 and a header 6 mating with the card connector 9.

Turn to FIG. 1, the card connector 9 comprises an insulative base 1, a plurality of terminals 2 received in the base 1, a metallic shell 3, a frame 4 attached to the base 1, and a card ejector 5 assembled on the frame 4. The insulative base 1 has a card engaging face 10 and an opposite header engaging face 11. A tongue portion 12 extends from the header engaging face 11 and defines thereon a plurality of recesses 121 (FIG. 2) on opposite surfaces extending through the header engaging face 11 to the card engaging face 10. On a top surface of the tongue portion 12, a number of grooves 122 are staggeredly arranged with the recesses 121 and extend to the header engaging face 11. The insulative base 1 also has a pair of arms 131 located at opposite lateral sides thereof.

Figure 2:
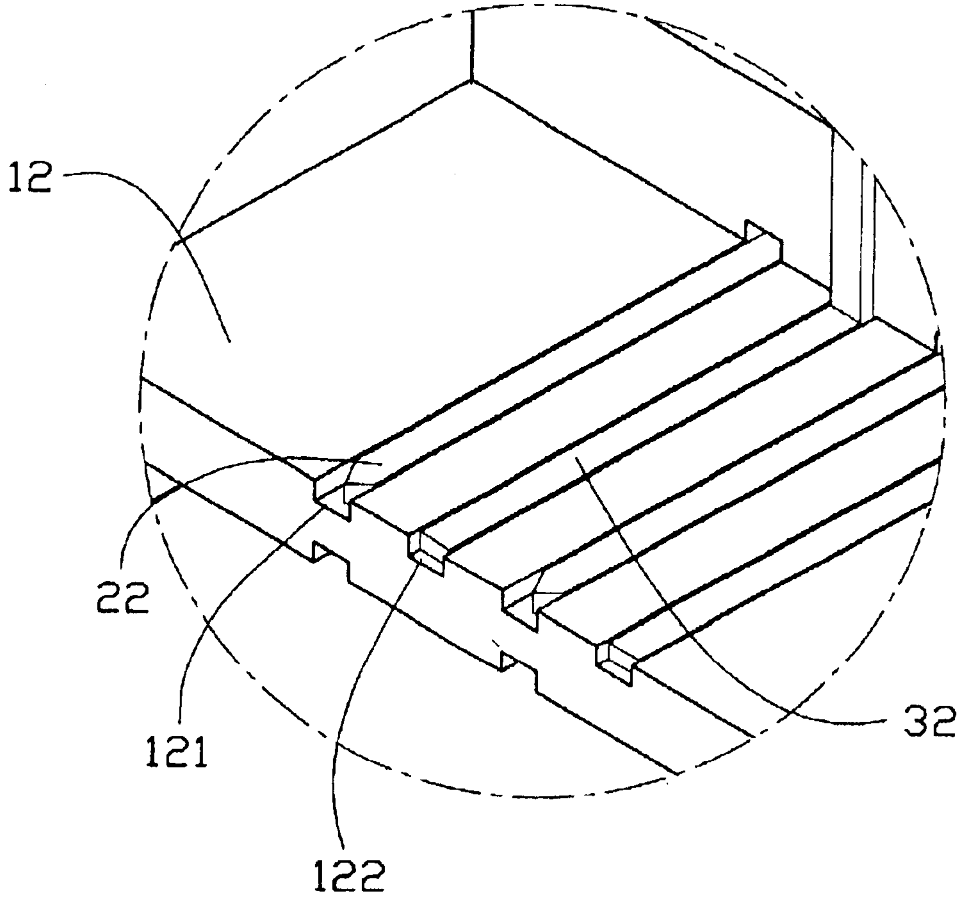
FIG. 2 is a partially enlarged view of FIG. 1.

Referring to FIG. 1 in conjunction with FIG. 2, each terminal 2 received in the insulative base 1 comprises a card engaging portion 21 extending beyond the card engaging face 10 for electrically connecting with the card, and a mating portion 22 retained in the recess 121 of the tongue portion 12 for electrically connecting with the header 6, which will be described in great detail hereinafter.

The metallic shell 3 is stamped from a metal sheet and is configured with a flat plate 30 covering the insulative base 1 above the card engaging portions 21 of the terminals 2 for shielding purpose. A plurality of resilient tabs 31 are stamped from the flat plate 30 for electrically connecting with corresponding grounding part of the card and a plurality of grounding fingers 32 opposite to the resilient tabs 31 are formed to be received in corresponding grooves 122 of the insulative base 1 for achieving an effective EMI. The frame 4 assembled onto the insulative base 1 is structured to receive the card. The frame 4 includes a pair of parallel extended, guiding arms 41, each guiding arm 41 defining an inner channel 43 on an inner side for receiving lateral edge of the card, and defining an outer channel 42 for firmly receiving the two arms 131 of the insulative base 1.

Referring to FIG. 1 in conjunction with FIG. 3, the card ejector 5 comprises a base section 51, a rotatable section 52 assembled on the base section 51, an ejecting section 53, and a handling section 54. The base section 51, the rotatable section 52 and the ejecting section 53 are mechanically interconnected with each other in a manner known to those skilled in the art, and are together fixed to the frame 4 via a pair of fastening legs 511 which extends oppositely from the base section 51 along an insertion direction of the card. The handling section 54 is pivotably attached to the rotatable section 52 and is movably assembled on the frame 4. When the handling section 54 is exerted with an external force, the rotatable section 52 and the ejecting section 53 are consequently driven to eject the received card out.

In assembly, the terminals 2 are first assembled in the insulative base 1 with the mating portions 22 being received in the corresponding recesses 121 of the tongue portion 12 and the card engaging portions 21 exposed towards the insertion direction of the card. Then, the metallic shell 3 is attached to the insulative base 1 with the grounding fingers 32 being retained in the corresponding grooves 122 and staggering with the mating portions 22 of the terminals 2. Finally, the insulative base 1 and the frame 4 on which the card ejector 5 is attached, are mechanically assembled together with the two guiding arms 131 are secured in corresponding outer channels 42 of the frame 4.

Figure 4:
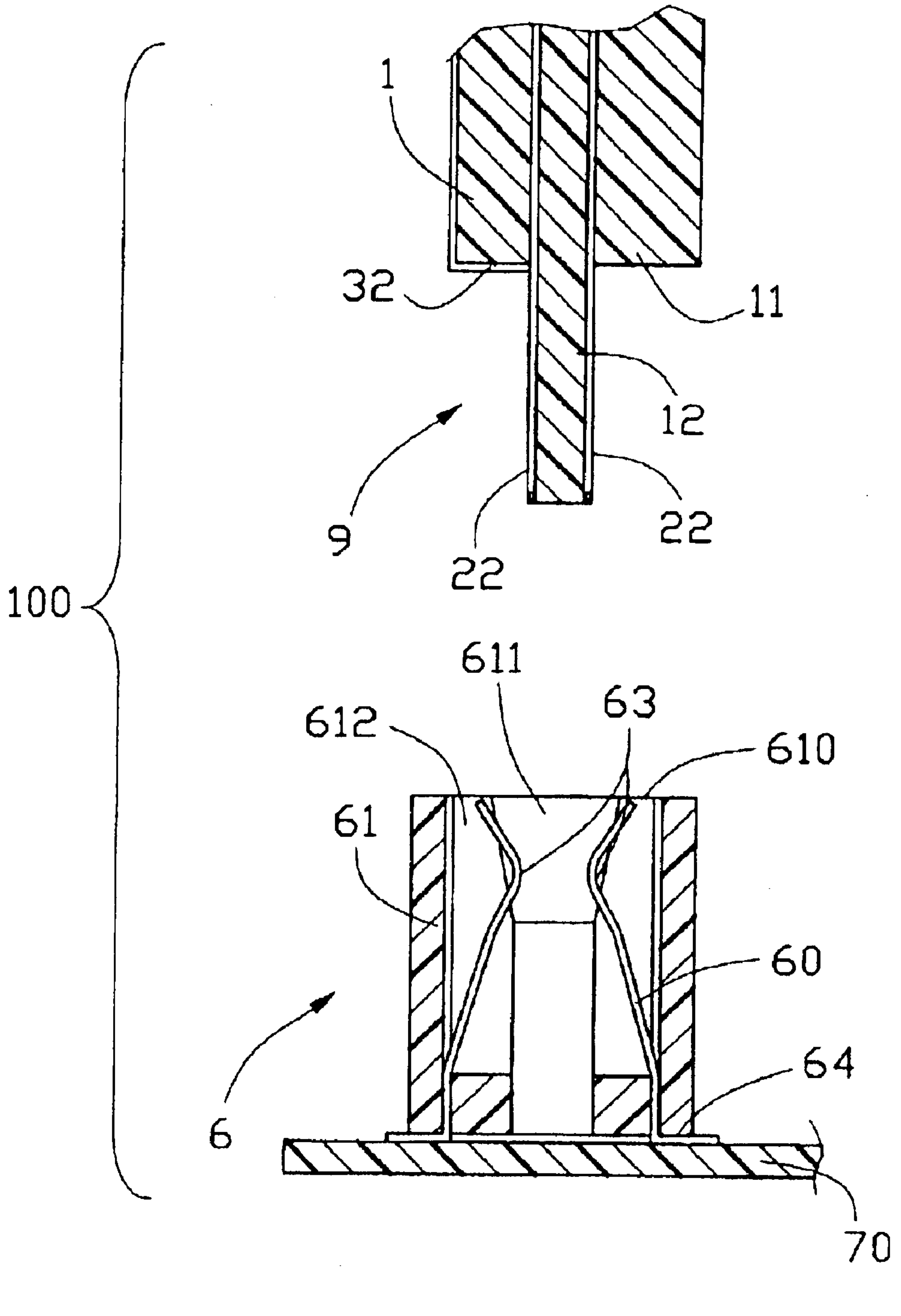
FIG. 4 is a cross-section view of FIG. 3 taken along line 4—4 wherein the card connector is partially removed.

Turn to FIGS. 3 and 4, the header 6 of the card connector assembly 100 includes an insulative housing 61 and a plurality of contacts 60 retained in the housing 61. The housing 61 has a top surface 610 parallel with the printed circuit board 70 on which the header 6 is mounted, and defines a longwise-extended slot 611 on the top surface 610 for receiving the tongue portion 12 of the card connector 9, and a plurality of passageways 612 communicating with the slot 651 for receiving corresponding contacts 60. Each contact 60 comprises a contacting portion 63 exposed in the slot 611 to conductively connect with corresponding terminal 2 and a soldering tail 64 extending beyond a bottom surface of the insulative housing 61 for soldering with corresponding circuit traces printed on the printed circuit board 70.

In use, the header 6 is perpendicularly soldered on the printed circuit board 70, and the card connector 9 engages with the header 6 with the tongue portion 12 vertically straightly received in the slot 611 and the contacts 60 electrically connecting with the terminals 2 to thereby establish conductive paths from the card engaged within the card connector 9 to the board 70. Therefore, horizontal space above the printed circuit board 70 is notably saved. On the other hand, an additional suction cap (not shown) is adapted to be attached to the header 6 for positioning the header on the printed circuit board 70 by a vacuum nozzle for an automatic soldering procedure. Understandably, directly soldering the card connector on the printed circuit board in a vertical type, can not use the vacuum nozzle for placing the card connector on the right position on the printed circuit board, and the vertical operation of the card may impose improper forces on the soldered portions of the contacts if they are directly soldered on the printed circuit board.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electronic device assembly, comprising:

a board having circuit traces thereon;

a header mounted on the board and having contacts electrically connected with corresponding circuit traces on the board, the header defining a slot in a surface thereof that is generally parallel with the board; and a card connector having an insulative base, a plurality of terminals attached to the insulative base and a pair of guiding arms located at opposite sides of the insulative base, the guiding arms each defining a guiding channel in an inner elongate side thereof for guiding insertion of an electronic card to engage with the terminals, the card connector mating with the header connector with the elongated sides of the guiding arms being perpendicular with the board, the card connector having a tongue portion received in the slot of the header and defining a row of recesses receiving mating portions of the terminals therein and wherein the card connector further comprises a metallic shell located above the terminals, wherein this metallic shell has a row of fingers staggered with mating portions of corresponding terminals.

2. The electronic device assembly as described in claim 1, wherein the card connector her comprises a card ejector attached therewith for ejecting the electronic card.

3. A card connector assembly for perpendicularly connecting an electronic card with a printed circuit board, comprising:

a first connector for mounting on the printed circuit board, the first connector comprising an insulative housing forming a top face and an opposite bottom face for engaging with the printed circuit board, a plurality of contacts received in the housing, and a lengthwise-extended slot defined through the top face to the bottom face; and a second connector for receiving therein the electronic card, the second connector comprising an insulative base forming a tongue portion, a plurality of terminals assembled on the tongue portion for electrically engaging with the contacts of the first connector, a frame assembled on the insulative base, and a metallic shell attached on the insulative base and above the terminals, the frame defining a pair of opposite channels extending parallelly to the tongue portion for guiding insertion of the electronic card;

wherein the tongue portion of second connector is vertically received in the slot of the first connector from the top face with the terminals respectively connecting with the contacts.

4. The card connector assembly as described in claim 3, wherein the second connector further comprises a card ejector assembled on the frame.

5. An electronic device assembly comprising:

a printed circuit board;

a header connector having an elongated housing defining two rows of contacts by two sides thereof, said each of contacts including an upwardly extending mating section and a horizontally extending solder section seated upon the printed circuit board, said housing being configured to have a suction cap attached thereon in an automatic soldering procedure; and a card connector including an insulative base, a plurality of terminals attached to the insulative base and a pair of guiding arms located at opposite sides of the insulative base, the guiding awls each defining a guiding channel in an inner elongate side thereof for guiding insertion of an electronic card therealong, the card connector vertically mating with the header connector with the contacts engaged with the corresponding terminals, respectively, and with the elongate side of the guiding arms being perpendicular with the board; wherein distal ends of the guiding arms are farther away from the printed circuit board than the base.

* * * * *